(12) United States Patent  
Ngai

(10) Patent No.: US 9,030,253 B1  
(45) Date of Patent: May 12, 2015

(54) INTEGRATED CIRCUIT PACKAGE WITH DISTRIBUTED CLOCK NETWORK

(75) Inventor: Tony Ngai, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/484,108

(22) Filed: May 30, 2012

(51) Int. Cl.
 H05K 3/30 (2006.01)
 H01L 25/00 (2006.01)

(52) U.S. Cl.
 CPC . H01L 25/00 (2013.01); H05K 3/30 (2013.01)

(58) Field of Classification Search
 CPC .................................. H01L 25/00; H05K 3/30
 USPC ......... 327/565, 564, 566, 594, 595, 597, 291, 327/293, 295, 296, 297, 298, 299, 141, 327/144; 257/E23.141, E23.168, E23.169, 257/E23.174, E23.175, E23.178
 See application file for complete search history.

(56) References Cited

U.S. PATENT DOCUMENTS

| | | | |
|---|---|---|---|
| 5,164,817 A | 11/1992 | Eisenstadt et al. | |
| 5,656,963 A | 8/1997 | Masleid et al. | |
| 5,760,478 A | 6/1998 | Bozso et al. | |
| 5,866,924 A | 2/1999 | Zhu | |
| 5,923,188 A | 7/1999 | Kametani et al. | |
| 6,323,942 B1 | 11/2001 | Bamji | |
| 7,679,416 B2 | 3/2010 | Cheng et al. | |
| 2008/0204104 A1* | 8/2008 | Peng | 327/293 |
| 2010/0277210 A1* | 11/2010 | Wang et al. | 327/147 |
| 2012/0146693 A1* | 6/2012 | Lee et al. | 327/158 |
| 2013/0021079 A1* | 1/2013 | Jeong | 327/286 |
| 2013/0039112 A1* | 2/2013 | Riho | 365/63 |
| 2013/0049825 A1* | 2/2013 | Silberman et al. | 327/141 |
| 2013/0049826 A1* | 2/2013 | Kim et al. | 327/141 |
| 2013/0049827 A1* | 2/2013 | Bucelot et al. | 327/144 |
| 2013/0094272 A1* | 4/2013 | Riho | 365/63 |

* cited by examiner

Primary Examiner — Lincoln Donovan  
Assistant Examiner — Jung Kim

(57) ABSTRACT

Integrated circuit (IC) packages with multiple clock sources are disclosed. A disclosed IC package includes a first die having a first clock source and a first clock tree and a second die having a second clock source and a second clock tree. The first clock source and the second clock source may be coupled to the second clock tree and the first clock tree, respectively, through a plurality of interconnects to form a clock tree network on the IC package. The clock tree network may be operable to be driven by either the first clock source or the second clock source.

14 Claims, 10 Drawing Sheets

INTEGRATED CIRCUIT PACKAGE WITH DISTRIBUTED CLOCK NETWORK

BACKGROUND

An integrated circuit (IC) package may include multiple dies to support various increasingly complex applications. Different packaging configurations such as 2.5D and 3D packaging structures may be employed to meet specific requirements. Signals may thus travel from one die to another through solder bumps, wires, and various interconnect paths.

For instance, in a 2.5D IC device, multiple dies may be placed adjacent to each other on an interposer (e.g., a silicon interposer). The dies may then be coupled to each other through various routing paths on the interposer. Alternatively, in a 3D IC device, the dies in the IC package are stacked on top of each other and may be coupled to each other through various interconnections such as microbumps and through-silicon vias (TSVs).

As signals, and more specifically, clock signals, need to be transmitted to different elements in the IC device, a clock distribution network (or clock tree) needs to be formed in the IC device. Conventional clock distribution networks are not, however, suitable for integrated circuit packages such as 2.5D and 3D integrated circuit packages at least because such conventional clock distribution networks would suffer from undesirable clock skew in 2.5D and 3D IC packages.

SUMMARY

A distributed clock tree structure that may be able to drive several different clock trees is desirable for a multi-die device. It may be also be desirable if the distributed clock tree structure allows each of the dies in the multi-die device to be tested independently. Embodiments of the present invention include multi-die integrated circuit (IC) devices with a distributed clock tree structure.

It is appreciated that the present invention can be implemented in numerous ways, such as a process, an apparatus, a system, a device, or a method on a computer readable medium. Several inventive embodiments of the present invention are described below.

In one embodiment, an IC package is disclosed. The IC package includes a first die with a first clock source and a first clock tree, and a second die with a second clock source and a second clock tree. The IC package further includes a plurality of interconnects that are operable to couple the first and second clock sources to the first and second clock trees. The first and second clock trees and the plurality of interconnects may form a clock tree network on the integrated circuit package. The clock tree network may further be operable to be driven by either one of the first and second clock sources.

In another embodiment, another IC package is disclosed. The IC package includes a first die with a first clock tree formed along a first axis and a second die with a second clock tree formed along the same axis. The first die is disposed over a second die and a plurality of interconnects may be used to couple the first and second clock trees to each other to form a global clock tree. The global clock tree may include a plurality of clock spines extending along a second axis through the first and second dies. Each of the clock spines may be operable to be coupled to a respective one of the plurality of clock sources.

In yet another embodiment, method of packaging an IC is disclosed. The method includes disposing a first die with a first clock source and a first clock tree over a substrate. A second die with a second clock source and a second clock tree is disposed over the first die. The first clock tree is coupled to the second clock tree to form a third clock tree. The third clock tree may include a plurality of clock spines extending vertically along a first axis through the first and second dies. At least one clock spine from the plurality of clock spines may be driven with the first clock source.

Further features of the invention, its nature and various advantages, will be more apparent from the accompanying drawings and the following detailed description of the preferred embodiments.

DETAILED DESCRIPTION

The embodiments provided herein include integrated circuit (IC) packages and techniques to package a multi-device structure with a distributed clock tree network.

It will be obvious, however, to one skilled in the art, that the present exemplary embodiments may be practiced without some or all of these specific details. In other instances, well-known operations have not been described in detail in order not to unnecessarily obscure the present embodiments.

An integrated circuit (IC) package may include numerous integrated circuit dies that are placed on top of each other, or placed adjacent to each other, on a common substrate. The dies in the IC package may be different from or identical to each other. Accordingly, when multiple dies are placed, or stacked, in a single IC package, a full-chip distributed clock tree network, or a global clock tree, is needed as signals in the IC package may need to travel from one die to another.

One of the embodiments describes a multi-die IC package with an interposer that may include interconnection paths to form a 2.5D clock distribution network. The IC package may include two or more dies, each with its own clock tree. The different clock trees may thus be coupled together to form a global 2.5D clock distribution network through the various interconnection paths in the interposer.

Another embodiment describes an IC package with stacked dies. A global clock distribution network may be formed through TSVs and microbumps that connect the stacked dies to one another. Each of the dies may also include an independent clock source and a clock tree structure within the die and the global clock distribution network may include various clock paths from the different clock tree structures within each of the dies. For instance, each individual die may include a complete and balanced clock tree structure, such as an H-tree clock structure, to minimize clock skew and allow each die to be tested individually. This may be needed as a single defective die may lead to a full chip failure if the dies within the IC package could not be individually tested.

Accordingly, as each die in the IC package may have a different clock tree, in one embodiment, all the different clock trees may be coupled together to form a balanced global clock tree on the IC package. In another embodiment, different clock sources, such as phase-locked loops (PLLs), on different dies may also be accessible through the global clock tree so that each of the dies in the IC package may be driven by any of the different clock sources as needed.

Figure 1A:
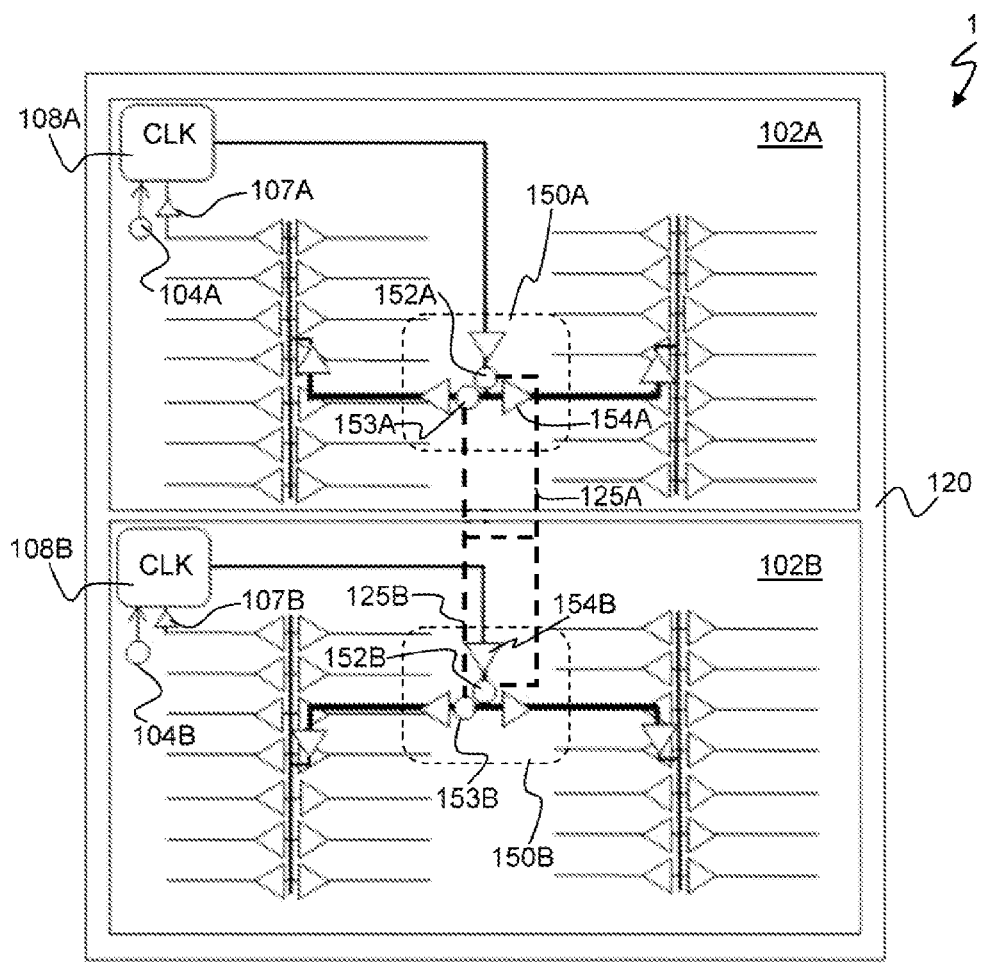
FIG. 1A is a top-down view of an illustrative IC package with two dies, placed adjacent to each other, on an interposer in accordance with an embodiment of the present invention.

FIG. 1A is a top-down view of an illustrative IC package 100 with two dies, 102A and 102B, placed adjacent to each other on interposer 120 in accordance with an embodiment of the present invention. It should be appreciated that interposer 120 may be a silicon interposer with bump pads on its top surface (or the surface adjacent to dies 102A and 102B) and dies 102A and 102B may be flip chip dies with a plurality of microbumps 152A, 153A, 152B and 153B on at least one side of each of the dies.

In the embodiment of FIG. 1A, dies 102A and 102B may be substantially similar to each other, each with its own clock source (108A and 108B), and an independent clock tree. For instance, clock source 108A in die 102A is coupled to the clock tree (shown as an H-tree structure with numerous clock buffers 154A) in die 102A. Clock source 108A may, if desired, include a feedback input coupled to input buffer 107A. It should be appreciated that clock source 108A may be a phase-locked loop (PLL) circuit that may be coupled to a clock input signal (either external or internal) through input 104A.

Similarly, in the embodiment of FIG. 1A, die 102B has an H-tree clock structure with numerous clock buffers 1548 coupled to clock source 108B. In one embodiment, clock source 108B may be a PLL circuit that is coupled to receive a feedback clock signal through input buffer 107A. Clock source 108B may receive a clock input signal through input 104A. In one embodiment, input 104A may be a bump or a bump pad on die 102B and the clock input signal may be received from an external circuit that may be coupled to IC package 100.

Signals from dies 102A and 102B may travel between the two dies through interposer 120. In the embodiment of FIG. 1A, interposer 120 may include its own clock tree with a plurality of clock paths (as represented by dotted lines 125A and 125B). As each of dies 102A and 102B may have a complete clock tree, the clock trees in dies 102A and 102B may be coupled to each other through a plurality of interconnects (e.g., interconnectors formed by paths 125A and 125B). In one embodiment, the plurality of interconnects is formed by microbumps 152A and 153A and microbumps 152B and 153B on the underside of dies 102A and 102B, respectively, a plurality of bump pads on the top surface of interposer 120, and clock paths such as clock paths 125A and 125B in interposer 120.

In one embodiment, each of dies 102A and 102B may be driven by clock source 108A or 108B, depending on how the clock sources (108A and 108B) are routed. It should be appreciated that enable circuits, details of which will be described in subsequent paragraphs, may be used to enable different clock sources and route signals or clock signals through different clock paths 125A and 125B on interposer 120. In the embodiment of FIG. 1A, enable circuits may be placed in a center region (enclosed in a dotted-line border) 150A and 150B of each of the clock trees in dies 102A and 102B, respectively.

Figure 1B:
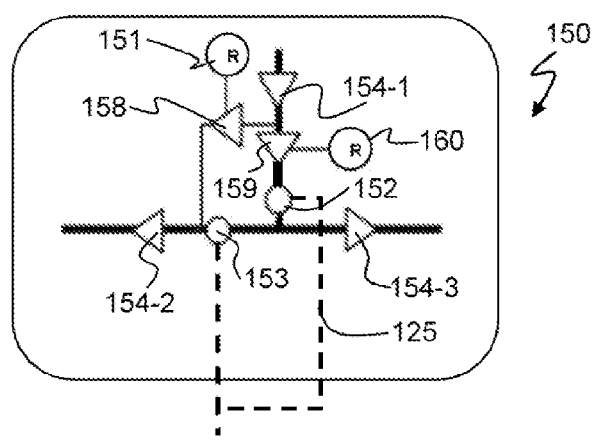
FIG. 1B shows an illustrative portion of a clock tree in the IC package of FIG. 1A in accordance with one embodiment of the present invention.

FIG. 1B shows an illustrative portion of a clock tree in the IC package of FIG. 1A in accordance with one embodiment of the present invention. It should be appreciated that center region 150 may be similar to center region 150A or 150B of FIG. 1A. In one embodiment, enable circuit 158 is coupled to the output of clock buffer 154-1 and the input of clock buffer 154-2 and clock buffer 154-3. An enable bit 151 may be coupled to enable circuit 158. In an exemplary embodiment, enable circuit 158 may be enabled and disabled according to enable bit 151. For instance, when the enable bit is at a logic high level, enable circuit 158 may be enabled and the output of clock buffer 154-1 may be routed to clock buffers 154-2 and 154-3. Alternatively, when the enable bit is at a logic low level, enable circuit 158 may be disabled such that the output of clock buffer 154-1 will not be routed to either of clock buffers 154-2 and 154-3. In one embodiment, either clock source 108A or 108B of FIG. 1A and its associated clock signals may be routed to both dies 102A and 102B through an appropriate microbump 152, interposal clock path 125, and an appropriate microbump 153 when an appropriate enable circuit 159 is enabled (e.g., when an appropriate enable bit 160 is at a logic high level).

Figure 1C:
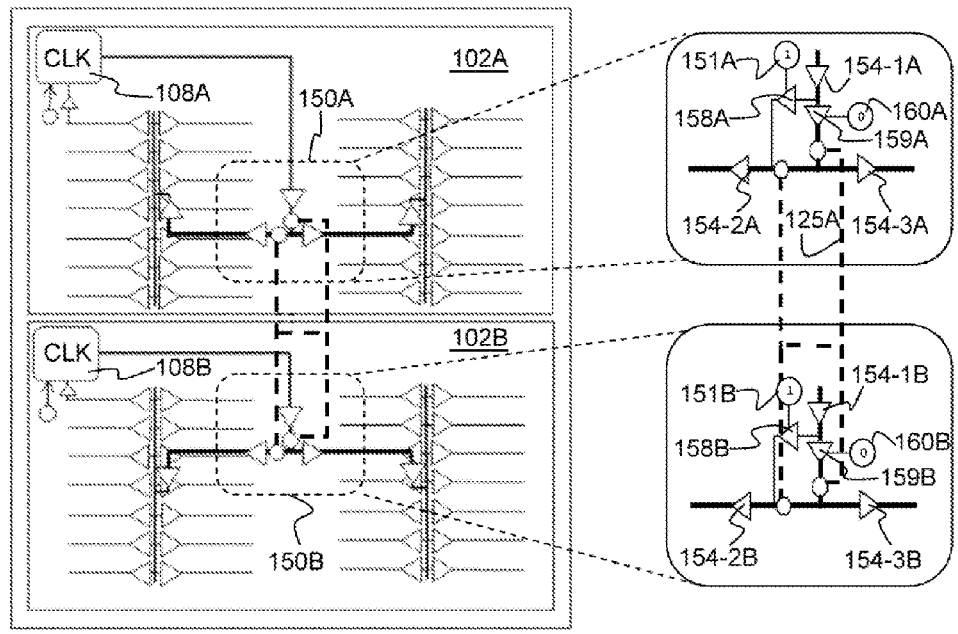
FIG. 1C, meant to be illustrative and not limiting, shows enable circuits at a common logic level when the dies are driven by two different clock sources in accordance with one embodiment of the present invention.

FIG. 1C, meant to be illustrative and not limiting, shows enable circuits 158A and 158B at a common logic level (e.g., enable circuits 158A and 158B turned on) and enable circuits 159A and 159B at a different common logic level (e.g., enable circuits 159A and 159B turned off) when dies 102A and 102B are driven by clock sources 108A and 108B, respectively, in accordance with one embodiment of the present invention. As shown in the embodiment of FIG. 1C, both configuration bits 151A and 151B of enable circuits 158A and 158B, respectively, are at a logic high level (e.g., logic level 1) and both configuration bits 160A and 160B are at a logic low level (e.g., logic level 0). Accordingly, clock signals from clock source 108A are routed to the clock tree in die 102A through clock buffer 154-1A and enable circuit 158A, and clock signals from clock source 108B are routed to the clock tree in die 102B through clock buffer 154-1B and enable circuit 158B. When enable circuits 158A and 158B are enabled, enable circuits 159A and 159B may be disabled to prevent clock signals from being routed through the interposal clock paths (e.g., interposal clock path 125A).

Figure 1D:
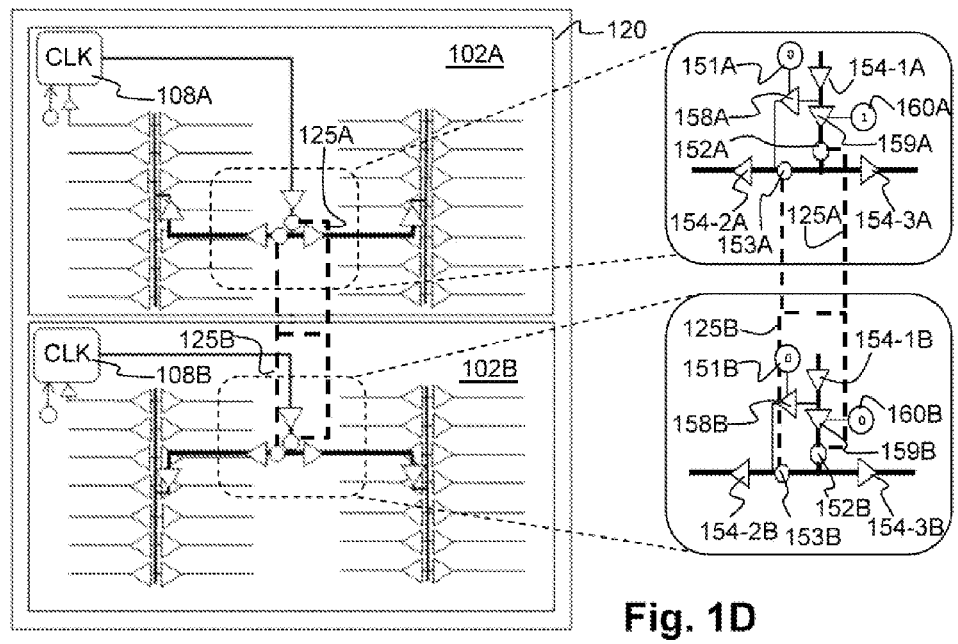
FIGS. 1D and 1E, meant to be illustrative and not limiting, shows the enable circuits at different logic levels when both the dies are being driven by a single clock source in accordance with one embodiment of the present invention.

FIG. 1D, meant to be illustrative and not limiting, shows enable circuits 158A, 158B, and 159B at a common logic level (e.g., enable circuits 158A, 158B, and 159B turned off) and enable circuit 159A at a different logic level (e.g., enable circuit 159A turned on) in accordance with one embodiment of the present invention. In the embodiment of FIG. 1D, both dies 102A and 102B may be driven by clock source 108A. Configuration bit 151A of enable circuit 158A may be at a logic low level (e.g., logic level 0), and configuration bit 160A of enable circuit 159A may be at a logic high level (e.g., logic level 1).

Accordingly, clock signals from clock source 108A may be routed through clock buffer 154-1A and enable circuit 159A to microbump 152A. From microbump 152A, the clock signals may be routed through interposal clock paths 125A and 125B to the clock trees in dies 102A and 102B (e.g., to microbumps 153A and 153B). The clock signals may be routed to the clock tree in die 102A through clock buffers 154-2A and 154-3A and to the clock tree in die 102B through clock buffers 154-2B and 154-3B. As such, both clock trees on dies 102A and 102B may be driven by clock source 108A in die 102A. In the embodiment of FIG. 1D, interposal clock paths 125A and 125B may form a balanced clock tree in interposal layer 120.

In the embodiment of FIG. 1D, enable circuit 158A may be disabled to prevent clock signals, from clock source 108A, from being routed to the clock tree in die 102A through enable circuit 158A as such a routing path may form an unbalanced clock tree structure when both dies 102A and 102B are being driven by clock source 108A. As both configuration bits 151B and 160B are at a logic low level, enable circuits 158B and 159B may be disabled. As such, clock signals from clock source 108B, which may be routed to clock buffer 154-1B, are not routed to clock buffers 154-2B and 154-3B or microbump 152B.

Figure 1E:
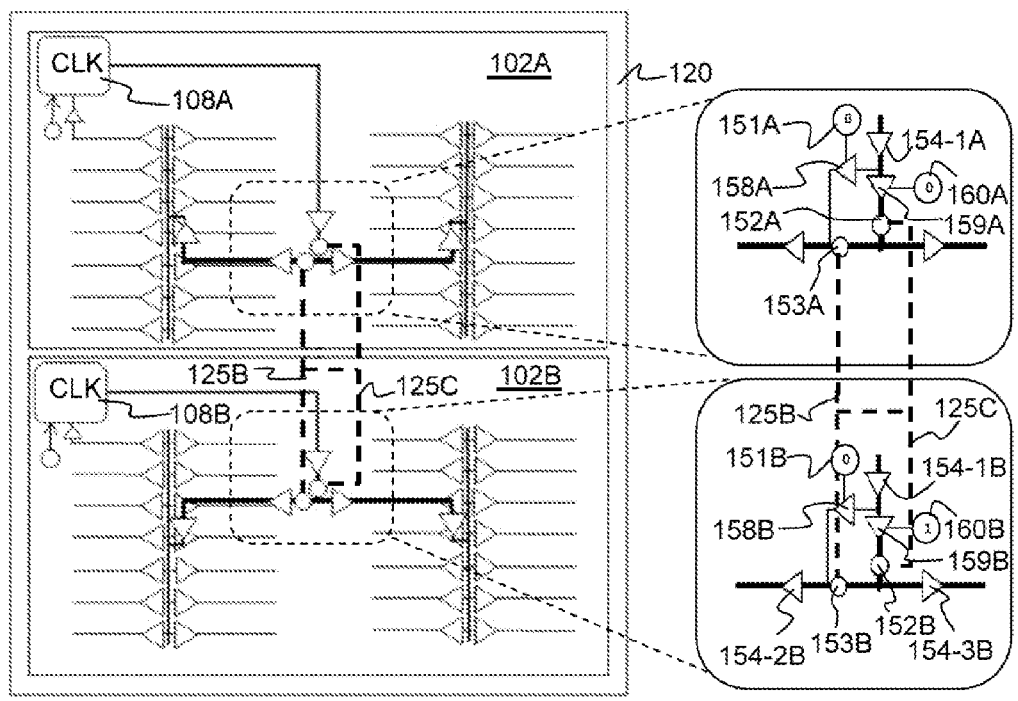

FIG. 1E, meant to be illustrative and not limiting, shows enable circuits 158A, 159A and 158B at one logic level (e.g., enable circuits 158A, 159A and 158B turned off) and enable circuit 159B at another logic level (e.g., enable circuit 159B turned on) when both dies 102A and 102B are being driven by clock source 108B in accordance with one embodiment of the present invention. As configuration bit 151A of enable circuit 158A is at a logic low level (e.g., logic level 0), enable circuit 158A may be disabled and as such, clock signals from clock source 108A may not be routed to the clock tree on die 102A. Similarly, configuration bit 160A of enable circuit 159A may be at a logic low level and clock signals from clock source 108A, which may be routed to clock buffer 154-1A, are not routed to die 102B through microbump 152A.

In the embodiment of FIG. 1E, configuration bit 160B of enable circuit 159B is coupled to a logic high level (e.g., logic level 1). Accordingly, clock signals from clock source 108B are routed to microbump 152B through enable circuit 159B. The same clock signals may then be routed from microbump 152B to the respective clock trees in dies 102A and 102B through interposal clock paths 125C and 125B, and microbumps 153A and 153B. As such, both clock trees in dies 102A and 102B may be driven by clock source 108B in die 102B. It should be appreciated that in the embodiment of FIG. 1E, configuration bit 151B of enable circuit 158B may be at a logic low level to prevent clock signals from clock source 108B from being routed to the clock tree in die 102B through enable circuit 158B as such a routing path may form a relatively unbalanced clock tree structure when both dies 102A and 102B are being driven by clock source 108B. Instead, clock signals from clock source 108B are routed to the clock tree (and clock buffers 154-2B and 154-3B) in die 102B through interposal clock paths 125C and 125B, and microbump 153B. In one embodiment, interposal clock paths 125B and 125C may form a relatively balanced clock tree structure in interposal layer 120.

Figure 2:
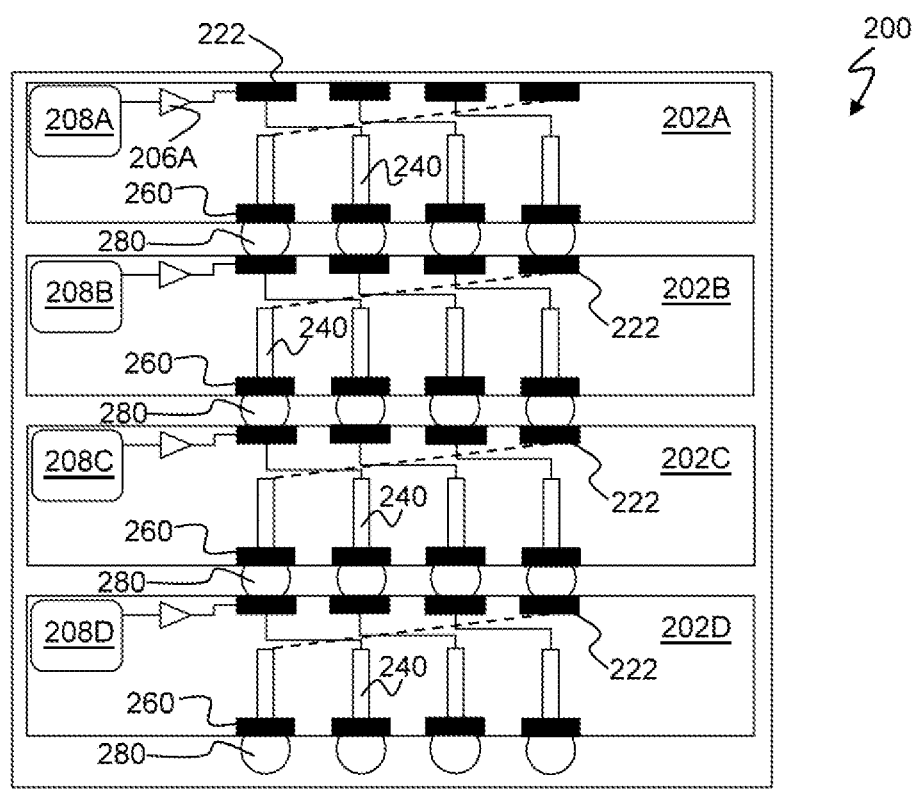
FIG. 2 is a side view of an illustrative multi-die IC package in accordance with an embodiment of the present invention.

FIG. 2 is a side view of an illustrative multi-die IC device 200 in accordance with an embodiment of the present invention. The embodiment of FIG. 2 shows four dies 202A-202D that may be stacked on top of each other. The four dies 202A-202D may be similar to each other and may each include a clock source, 208A-202D, respectively. Each of the dies 202A-202D may include a plurality of bump pads (top and bottom bump pads 222 and 260, respectively) coupled to a plurality of microbumps 280.

In the embodiment of FIG. 2, each of dies 202A-202D includes a clock source, 208A-208D, and a plurality of through-silicon vias (TSVs) 240. Each of the clocks sources 208A-208D may be coupled to any one of the dies 202A-202D through the plurality of TSVs 240. For instance, as shown in FIG. 2, clock source 208A may be coupled to the left-most top bump pad 222 of die 202A through clock buffer 206A, and coupled to the second bottom bump pad 260 of die 202A through TSV 240. Accordingly, a microbump 280 between dies 202A and 202A, which is coupled to the same TSV 240 in die 202A, is coupled both to the second bottom bump pad 260 of die 202A and the second top bump pad 222 of die 202B.

As shown in the embodiment of FIG. 2, clock source 208A is further coupled to die 202B through the second top bump pad 222 of die 202B, which is coupled to a diagonally adjacent TSV 240 in die 202B (the third TSV 240 from the left). The same TSV 240 in die 202B is coupled to the third bottom bump pad 260 and microbump 280 of die 202B. As shown in the embodiment of FIG. 2, clock source 208A may be further coupled to a top bump pad 222 on die 202C (the third top bump pad from the left), the right-most TSV 240, and bottom bump pad 260 of die 202C, and the right-most top bump pad 222 of die 202D. From the right-most top bump pad 222 of die 202D, clock source 208A may further be coupled to the left-most TSV 240 in die 202D.

Figure 3A:
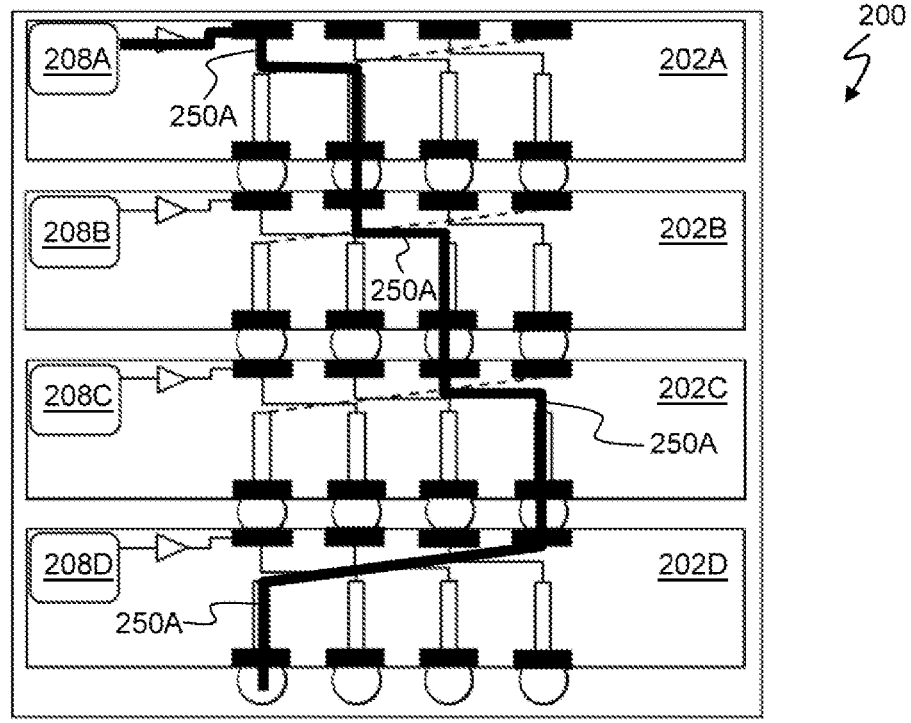
FIGS. 3A-3D show clock spines in the illustrative multi-die IC package driven by different clock sources as one embodiment in accordance with the present invention.
Figure 3B:
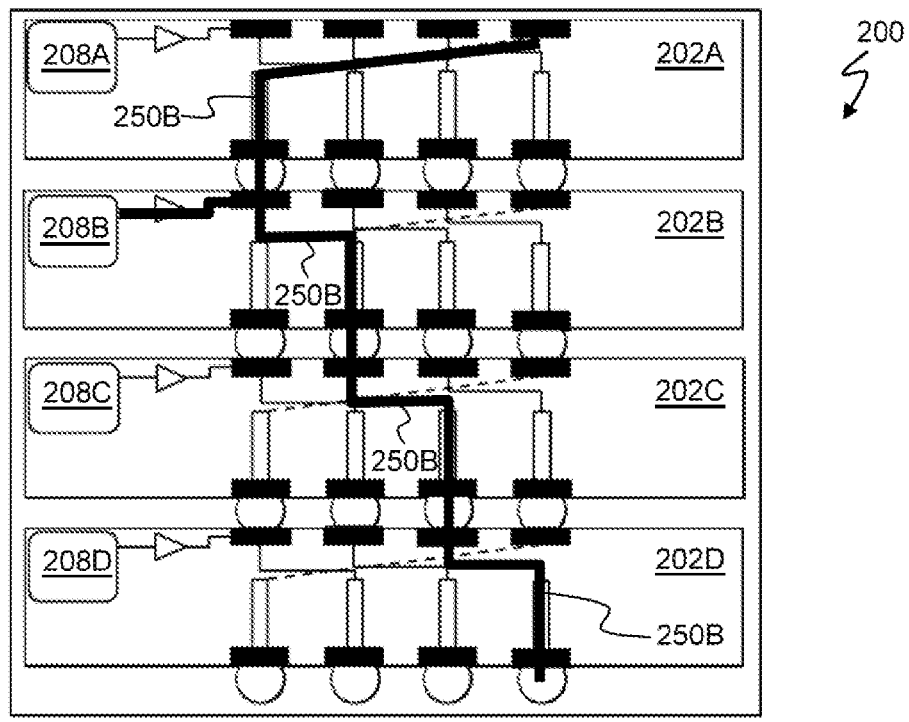
Figure 3C:
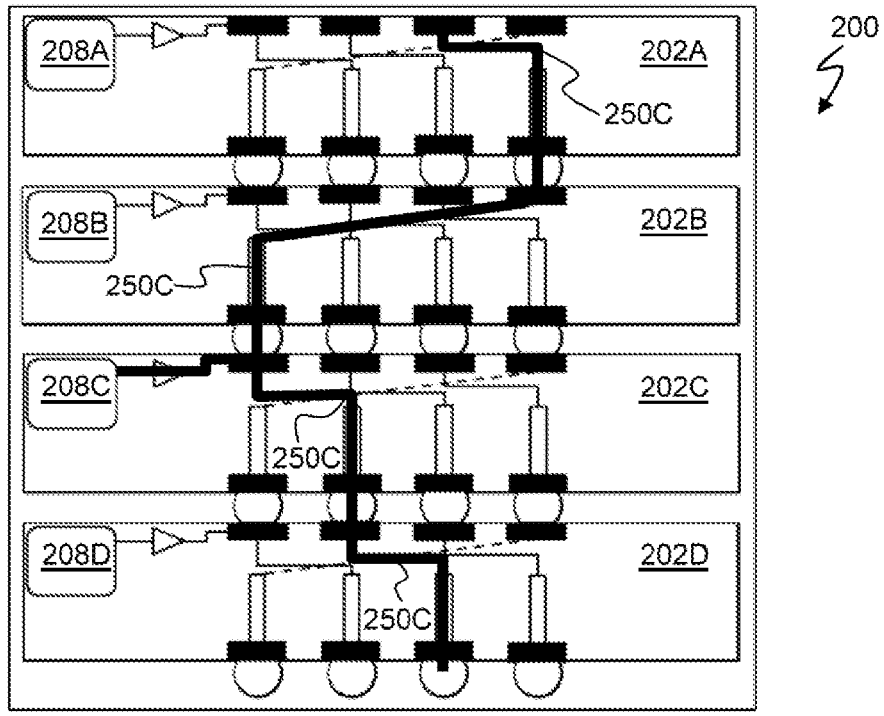
Figure 3D:
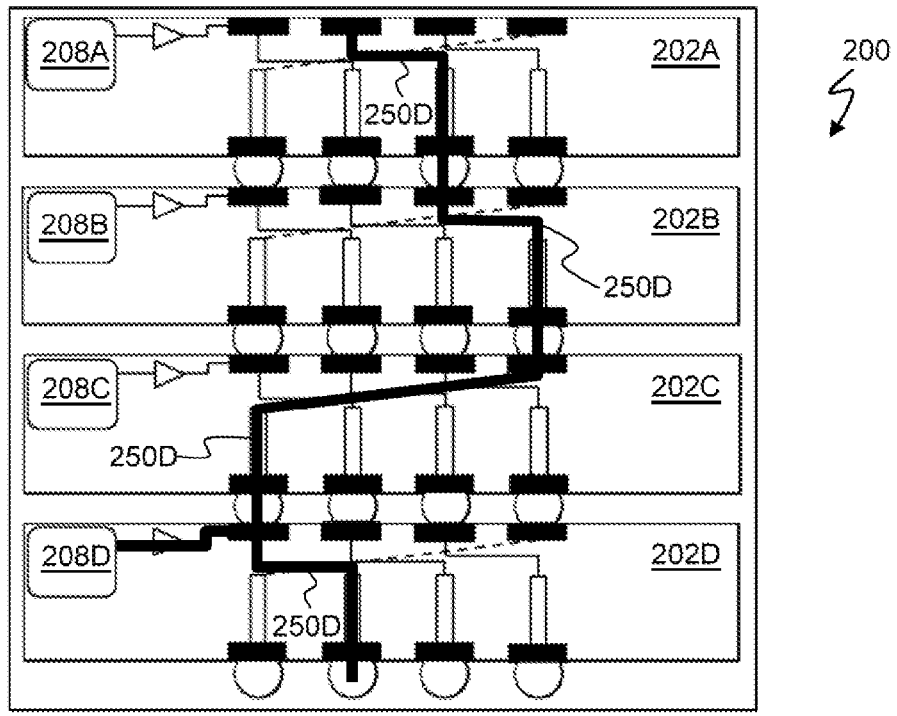

FIG. 3A shows clock spine 250A driven by clock source 208A in the illustrative multi-die IC package 200 as one embodiment in accordance with the present invention. In one embodiment, clock source 208A forms a clock spine that traverses dies 202A-202D in a "twisting" pattern. Accordingly, different clock spines may be formed in IC package 200 by clock sources 208B, 208C and 208D in similar fashion. FIGS. 3B, 3C and 3D show clock spines 250B, 250C and 250D, respectively. Clock spine 250B may be driven by clock source 208B of die 202B, while clock spines 250C and 250D may be driven by clock sources 208C and 208D, respectively. It should be appreciated that even though specific clock spines 250A-250D are shown in the embodiments of FIGS. 3A-3D, different clock spine configurations, driven by any of the clock sources 208A-208D, may be formed.

Figure 3E:
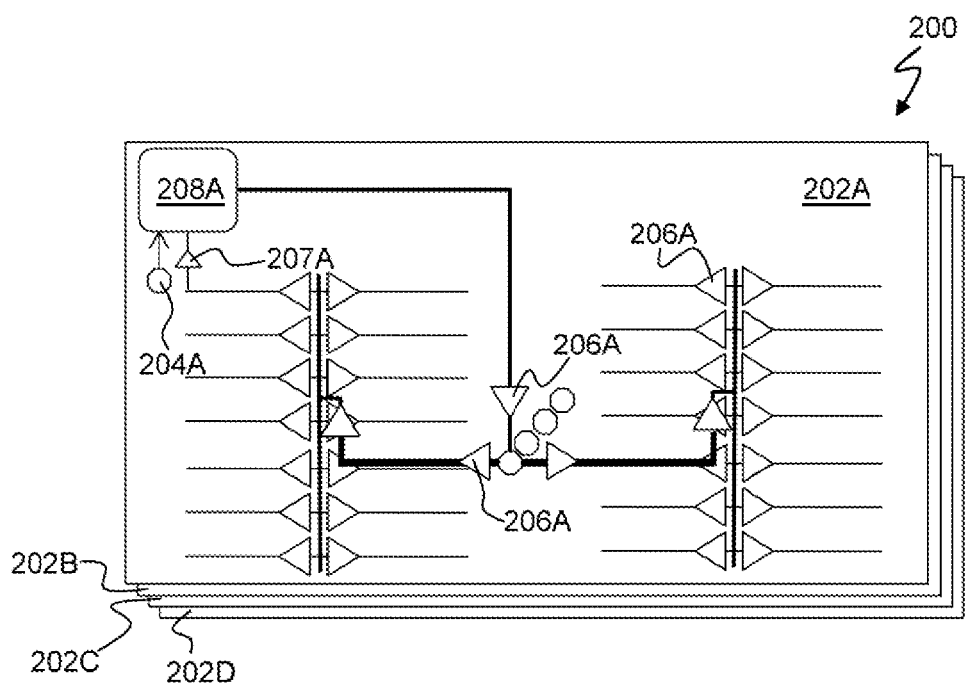
FIG. 3E is a top-down view of the illustrative multi-die IC package of FIGS. 3A-3D in accordance with one embodiment of the present invention.

FIG. 3E is a top-down view of illustrative IC package 200 in accordance with one embodiment of the present invention. A top-down view of die 202A is shown in the embodiment of FIG. 3E. Clock source 208A may be coupled to an input port 204A operable to receive an input clock signal. Clock source 208A coupled to receive a feedback clock signal from its own clock tree through input buffer 207A. In the embodiment of FIG. 3E, 202A has an H-structure clock tree with a plurality of clock buffers 206A. It should be appreciated that dies 202B-202D, stacked below die 202A, may include similar clock tree structures with their own clock sources.

In one embodiment, when dies 202A-202D are stacked on top of each other, another clock tree may be formed by coupling different clock paths from the various clock trees in dies 202A-202D. For instance, a global clock tree that spans across dies 202A-202D may be formed along an axis orthogonal to the top surface of dies 202A-202D. In the embodiment of FIG. 3E, the clock tree in die 202A may be driven by clock source 208A. The same clock source, 208A, may be used to drive different trees in dies 202B-202B (e.g., to drive different clock spines in the global clock tree in IC package 200).

In one embodiment, clock source 208A may be coupled to die 202B (placed below die 202A as shown in FIG. 3E), through a plurality of interconnects (e.g., TSVs, microbumps, bump pads, etc.) on dies 202A and 202B. The same clock source may further be transmitted to clock paths in die 202C and 202D through die 202B. As shown in the embodiments of FIGS. 3A-3D, different clock spines in the global clock tree may be driven by any one of the many clock sources (e.g., clock sources 208A-208D) in IC package 200.

Figure 4A:
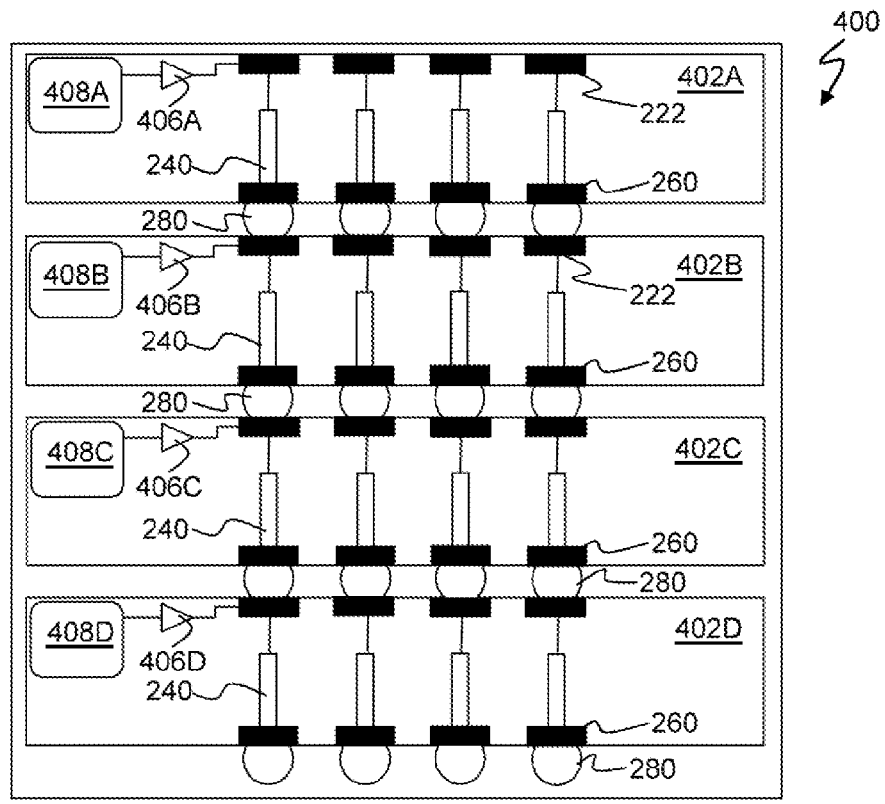
FIG. 4A is a side view of another illustrative multi-die IC package in accordance with an embodiment of the present invention.

FIG. 4A is a side view of an illustrative multi-die IC package 400 in accordance with an embodiment of the present invention. It should be appreciated that IC package 400 shares similarities with IC package 200, and as such, common elements that have been described in detail (e.g., TSVs 240, microbumps 280, and bump pads 222 and 260) will not be repeated. In the embodiment of FIG. 4A, each of the dies 402A-402D may include its own clock source 408A-408D.

Each of the clock sources 408A-408D may be coupled to a plurality of TSVs 240 through clock buffers 406A-406D, respectively. It should be appreciated that even though each of the clock source 408A-408D is shown coupled to the leftmost bump pad, bump pad 222, in the respective dies 402A-402D, the clock sources 408A-408D may be routed through different clock paths within IC package 400. In one embodiment, enable circuits (details of which will be described in subsequent paragraphs below) may be used to route clock signals from various clock sources through different clock paths or clock spines in the clock network of IC package 400.

Figure 4B:
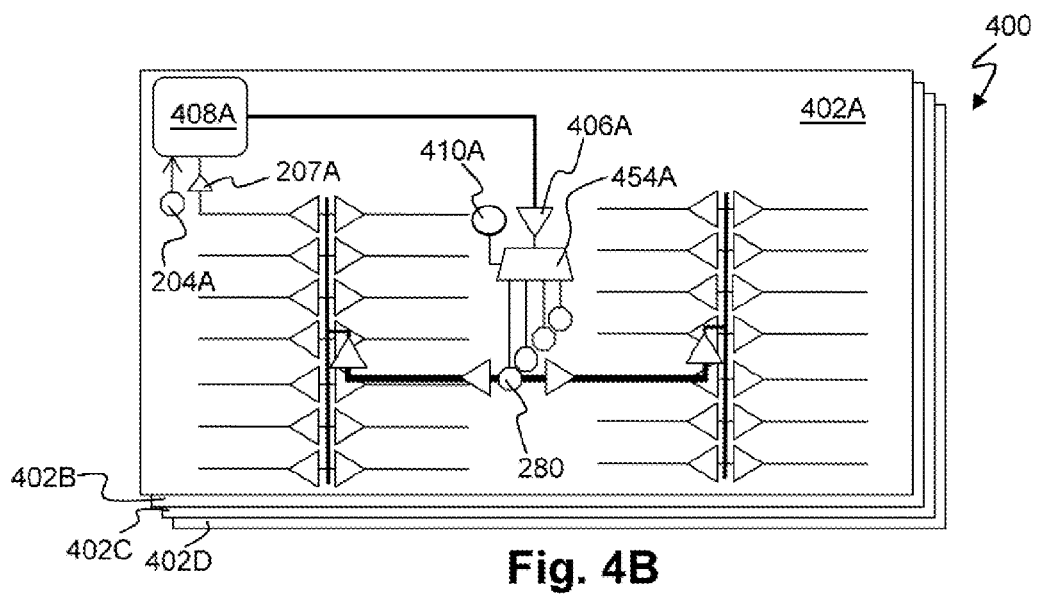
FIG. 4B is a top-down view of the illustrative multi-die IC package of FIG. 4A with an enable circuit in accordance with an embodiment of the present invention.

FIG. 4B is a top-down view of illustrative multi-die IC package 400 with selector circuit 454A in accordance with an embodiment of the present invention. It should be appreciated that die 402A includes an H-tree clock structure. In one embodiment, die 402A is the top-most die in the die stack with dies 402B-402D, stacked below it. It should also be appreciated that die 402A shares similarities with die 202A of FIG. 3E, and as such, elements that have been described above (e.g., input port 204A, input buffer 207A, etc.) will not be described in detail again.

In the embodiment of FIG. 4B, clock source 408A is coupled to selector circuit 454A through clock buffer 406A. Selector circuit 454A may be operable to couple clock source 408A to one of the four microbumps 280 shown in the embodiment of FIG. 4B. In an exemplary embodiment, select input 410A of selector circuit 454A may be coupled to receive a configuration bit, or configuration bits, from one of the dies 402A-402D. Depending on the configuration bit, selector circuit 454A may form different clock spines in the global clock network of IC package 400 by routing clock signals from clock source 408A through different clock paths. In one embodiment, each of dies 402B-402D may include a selector circuit, similar to selector circuit 454A, that may be configurable to route its respective clock source through different clock spines in the global clock network. Accordingly, clock signals from different clock sources, such as clock source 408A, may be configurable to be routed through the various clock spines. In an exemplary embodiment, selector circuit 454A may be a demultiplexer.

Figure 5:
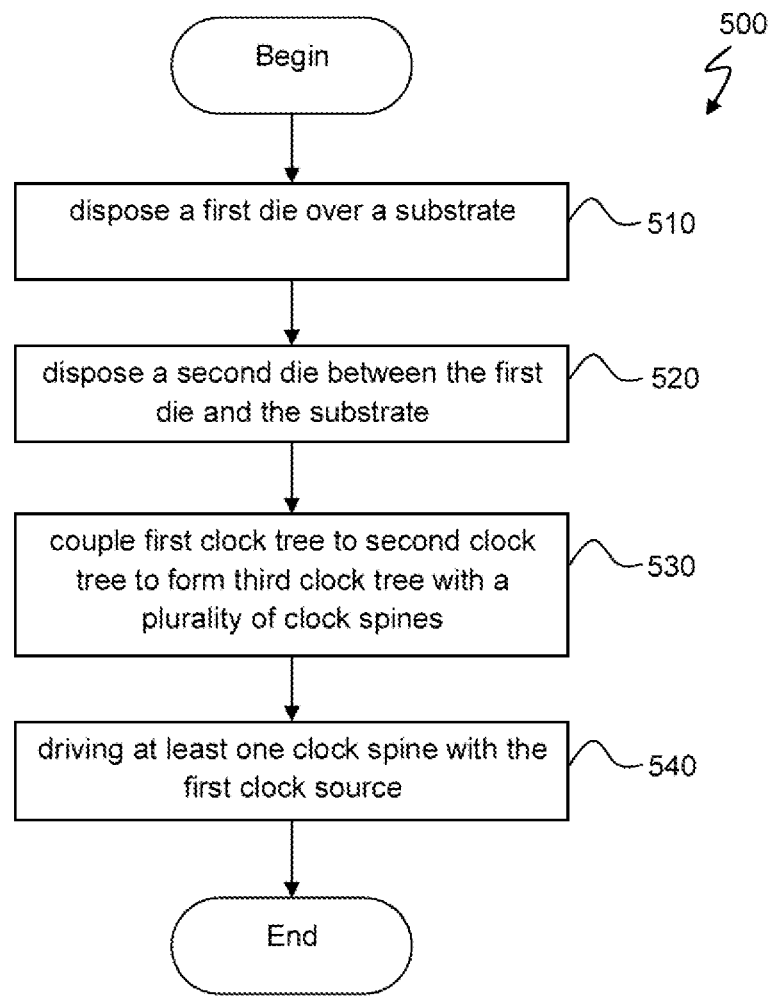
FIG. 5 shows illustrative steps involved in packaging an IC in accordance with one embodiment of the present invention.

FIG. 5 shows simplified method 500 for packaging an IC in accordance with one embodiment of the present invention. At step 510, a first die is disposed over a substrate. The first die may include a first clock source and a first clock tree. A second die is disposed over the first die at step 520. In one embodiment, the second die may include a second clock source and a second clock tree. In one embodiment, each of the dies may include an H-tree clock structure, similar to the clock tree shown in FIG. 3E, coupled to its own clock source. The first clock tree is coupled to the second clock tree to form a third clock tree at step 530.

In an exemplary embodiment, the third clock tree is a global clock tree that includes a plurality of clock spines that extends along a vertical axis through the first and second dies. For instance, as shown in FIG. 2, a global clock tree that extends vertically through IC package 200 is formed when clock paths on dies 202A-202D are coupled to each other through TSVs and microbumps. At step 540, at least one clock spine from the plurality of clock spines in the third clock tree is driven with the first clock source. In the embodiment of FIG. 2, different clock sources, 208A-208D, are used to drive the various clock spines in the global clock tree. In one embodiment, the dies may include enable circuits (e.g., selector circuit 454A of FIG. 4B) that may be coupled to a memory bit. Accordingly, the enable circuits may be configured to bypass a clock path in any of the first, second, or third clock trees.

Figure 6:
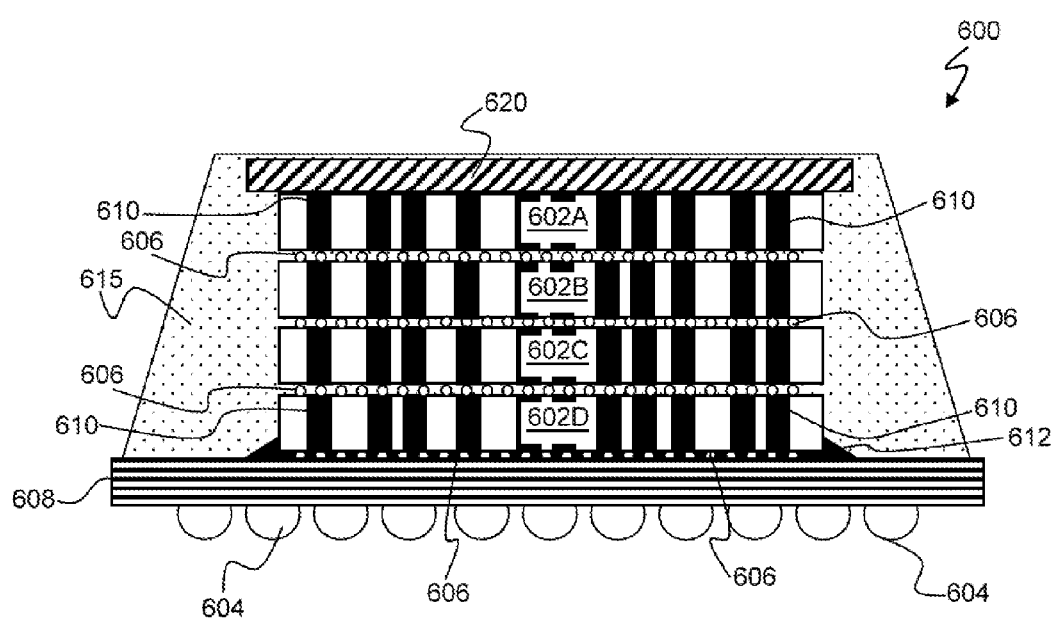
FIG. 6 is a side view of an illustrative IC package with four dies stacked on top of each other in accordance with an embodiment of the present invention.

FIG. 6 is a side view of an illustrative IC package 600 with four dies 602A-602D stacked on top of each other in accordance with an embodiment of the present invention. Heat spreader 620 may be placed over the stack of dies 602A-602D to allow heat to escape from IC package 600. In one embodiment, heat spreader 620 may be connected to die 602A through a non-conductive adhesive. It should be appreciated that dies 602A-602D may be flip chip dies with a plurality of microbumps 606 on one side of each of the dies. IC package 600 may be encapsulated by molding compound 615. In one embodiment, molding compound 515 may include an epoxy resin compound.

Dies 602A-602D, stacked on top of each other, may be disposed over substrate 608. It should be appreciated that the cavity between the plurality of microbumps 606 on die 602D and substrate 608 may be filled with under-fill material 612 or sealing resin to fill the gap and protect the solder joints between microbumps 606 and substrate 608. The pluralities of microbumps 606 on dies 602A-602C connect dies 602A-602C to each other and die 602D, and the plurality of microbumps 606 on die 602D in turn connects die 602D to substrate 608.

As an example, signals from dies 602A-602D may be transmitted outside of IC package 600 by solder balls 604 on the opposing side of substrate 608. In the embodiment of FIG. 6, each of dies 602A-602D may include a plurality of TSVs 610. Signals from any of dies 602A-602D may travel through the plurality of TSVs 610 and the plurality of microbumps 606 to substrate 608. In one embodiment, dies 602A-602D may be similar to dies 202A-202D of FIGS. 2, and 3A-3E, or 4A and 4B. Accordingly, a global clock tree may be formed by various interconnects in IC package 600 and clock signals may be routed through dies 602A-602D along a plurality of clock spines in the global clock tree.

It should be appreciated that even though specific configurations are shown in the embodiments of FIGS. 1A, 2, 4A, and 6, different configurations may be employed in this context. It should be appreciated that a flip chip package with a ball grid array is provided in the exemplary illustrations of FIG. 6. However, the use of flip chip ball grid array IC packages is not meant to be limiting as the techniques described herein may be applied to other packaging configurations (e.g., heat spreader ball grid arrays (HSBGAs), low profile ball grid arrays (LBGAs), thin fine pitch ball grid array (TFBGAs), flip chip chip-scale packages (FCCSPs), etc).

The method and apparatus described herein may be incorporated into any suitable circuit. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit package comprising:
  a first die having a first clock source and a first clock tree;
  a second die having a second clock source and a second clock tree; and
  a plurality of interconnects that couples the first clock source to the second clock tree and the second clock source to the first clock tree, the first and second clock trees and the interconnects forming a clock tree network on the integrated circuit package, wherein the clock tree network is driven by at least one of the first and second clock sources, wherein the first and second dies are stacked vertically with respect to one another, wherein the plurality of interconnects comprises a first plurality of microbumps on the first die, each microbump of the first plurality of microbumps coupled to a corresponding through-silicon via in the first die, a second plurality of microbumps on the second die, each microbump of the second plurality of microbumps coupled to a corresponding through-silicon via in the second die, and a multiplexing circuit on the first die, wherein the multiplexing circuit has a first input, a second input, and outputs, wherein each output of the multiplexing circuit is directly coupled to a different respective microbump in the first plurality of microbumps, and wherein the first clock source is routed from the first input to a selected one of the outputs based on control bits provided at the second input of the multiplexing circuit.

2. The integrated circuit package defined in claim 1, wherein each of the microbumps and the corresponding through-silicon via of the first die are electrically coupled to a diagonally adjacent microbump and through-silicon via in the second die to form a plurality of clock spines in the clock tree network.

3. The integrated circuit package defined in claim 2, wherein a first clock spine is driven by the first clock source, wherein a second clock spine is driven by the second clock source.

4. An integrated circuit package comprising:
  a first die having a first clock tree formed along a first axis and having a clock buffer;
  a second die having a second clock tree formed along the first axis, wherein the first die is disposed over a surface of the second die; and
  a plurality of interconnects that couples the first and second clock trees to each other to form a global clock tree, wherein the global clock tree comprises a plurality of clock spines extending along a second axis through the first and second dies, wherein each clock spine of the plurality of clock spines is coupled to a respective one of a plurality of clock sources, wherein the plurality of clock sources comprises a first clock source in the first die and a second clock source in the second die, wherein the clock buffer is interposed between the first clock source and the first clock tree, and wherein the first clock source receives a feedback signal from the first clock tree.

5. The integrated circuit package defined in claim 4 further comprising:
  a third die, having a third clock tree formed along the first axis and having a third clock source, wherein the plurality of interconnects couples the first, second, and third clock trees to each other to form the global clock tree.

6. The integrated circuit package defined in claim 5, wherein a first clock spine of the plurality of clock spines is coupled to the first clock source, and a second clock spine of the plurality of clock spines is coupled to the second clock source.

7. The integrated circuit package defined in claim 4, wherein the plurality of interconnects comprises a plurality of microbumps disposed between the first and second dies.

8. The integrated circuit package defined in claim 4, wherein the plurality of interconnects comprises:
  a first plurality of microbumps on the first die, each microbump of the first plurality of microbumps coupled to a corresponding through-silicon via in the first die; and
  a second plurality of microbumps on the second die, each microbump of the second plurality of microbumps coupled to a corresponding through-silicon via in the second die.

9. The integrated circuit package defined in claim 8, wherein each of the microbumps and the corresponding through-silicon via of the first die are electrically coupled to a diagonally adjacent microbump and through-silicon via in the second die to form the plurality of clock spines in the global clock tree.

10. The integrated circuit package defined in claim 4 further comprising:
  a plurality of enable circuits that couples one of the first and second clock sources to each spine of the plurality of clock spines.

11. A method of packaging an integrated circuit comprising:

disposing a first die having a first clock source, a first clock tree over a substrate;

disposing a second die having a second clock source and a second clock tree over the first die;

during a first mode, passing a first clock signal from the first clock source to the second die via a first group of microbumps while a second group of microbumps that are different than the first group of microbumps are not transmitting any clock signals; and during a second mode, passing a second clock signal from the second clock source to the first die via the second group of microbumps while the first group of microbumps are not transmitting any clock signals.

12. The method defined in claim 11 further comprising:

coupling the first clock tree to the second clock tree to form a third clock tree, wherein the third clock tree comprises a plurality of clock spines extending vertically along a first axis through the first and second dies;

disposing a third die having a third clock source and a fourth clock tree over the second die;

coupling the fourth clock tree to the third clock tree, wherein the plurality of clock spines extends vertically along the first axis through the first, second, and third dies; and driving each of the clock spines from a respective one of the first, second, and third clock sources.

13. The method defined in claim 12, wherein the driving each of the clock spines from a respective one of the first, second, and third clock sources comprises:

configuring a memory bit coupled to an enable circuit; and bypassing a path in one of the first clock tree, the second clock tree, the third clock tree, and a clock spine based on an output of the configured memory bit.

14. The method defined in claim 11, wherein the coupling the first clock tree to the second clock tree comprises:

coupling a first through-silicon via in the first die to a second through-silicon via in the second die.

* * * * *